US008817523B2

(12) United States Patent
Sugimae (10) Patent No.: US 8,817,523 B2
(45) Date of Patent: Aug. 26, 2014

(54) NON-VOLATILE SEMICONDUCTOR MEMORY DEVICE

(75) Inventor: Kikuko Sugimae, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 13/601,826

(22) Filed: Aug. 31, 2012

(65) Prior Publication Data

US 2013/0250655 A1 Sep. 26, 2013

(30) Foreign Application Priority Data

Mar. 26, 2012 (JP) .................................. 2012-068926

(51) Int. Cl.
*G11C 13/00* (2006.01)

(52) U.S. Cl.
USPC .......................................... 365/148; 365/100

(58) Field of Classification Search
USPC ................................................. 365/100, 148
See application file for complete search history.

(56) References Cited

U.S. PATENT DOCUMENTS

| 7,907,436 | B2 | 3/2011 | Maejima et al. |
| 7,911,854 | B2 | 3/2011 | Nagashima et al. |
| 8,179,714 | B2 | 5/2012 | Takagi et al. |
| 2007/0070682 | A1 | 3/2007 | Nakashima et al. |
| 2010/0235714 | A1 | 9/2010 | Toda |
| 2011/0103128 | A1 | 5/2011 | Kanno et al. |
| 2011/0284816 | A1* | 11/2011 | Fujii et al. .......................... 257/4 |

FOREIGN PATENT DOCUMENTS

| JP | 2000-011665 A | 1/2000 |
| JP | 2006-331626 A | 12/2006 |
| JP | 2007-80311 | 3/2007 |
| JP | 2008-21968 A | 1/2008 |
| JP | 2009-80901 A | 4/2009 |
| JP | 2009-193629 A | 8/2009 |
| JP | 2009-230849 A | 10/2009 |
| JP | 2010-218599 | 9/2010 |
| JP | 4563511 | 10/2010 |
| JP | 2011-100505 | 5/2011 |
| WO | WO 2010/047068 A1 | 4/2010 |

OTHER PUBLICATIONS

Japanese Office Action issued Nov. 13, 2012 in Patent Application No. 2010-213788 with English Translation.
Office Action issued Apr. 22, 2014, in Japanese Application No. 2012-068926, filed Mar. 26, 2012 (with English-language Translation), 8 pages.

* cited by examiner

*Primary Examiner* — Michael Tran
(74) *Attorney, Agent, or Firm* — Oblon, Spivak, McClelland, Maier & Neustadt, L.L.P.

(57) ABSTRACT

A non-volatile semiconductor memory device includes a memory cell array including a first wire, a second wire crossing the first wire, and a memory cell connected to both the wires at a crossing portion of the first wire and the second wire, the memory cell including a variable resistance element storing data in a non-volatile manner by a resistance value, and a control circuit setting the variable resistance element in first or second resistance state by application of first or second voltage to the memory cell and reading data from the memory cell by application of third voltage to the memory cell. The control circuit applies to the memory cell at predetermined timing weak write voltage causing the variable resistance element to be held in the first resistance state and the second resistance state.

18 Claims, 7 Drawing Sheets

FIG. 12

NON-VOLATILE SEMICONDUCTOR MEMORY DEVICE

CROSS-REFERENCE TO RELATED APPLICATIONS

This application is based upon and claims the benefit of priority from the prior Japanese Patent Application No. 2012-068926, filed on Mar. 26, 2012, the entire contents of which are incorporated herein by reference.

BACKGROUND

1. Field

Embodiments described herein relate to a non-volatile semiconductor memory device.

2. Description of the Related Art

As a memory storing large volumes of data for use, a resistance variable memory (ReRAM: Resistive RAM), which can be three-dimensionally formed easily, draws attention. Such a resistance variable memory is characterized by asymmetry properties in which voltage-current characteristics vary significantly depending on a direction of voltage to be applied to a memory cell.

On the other hand, the cell must have favorable data retention characteristics in order to make a non-volatile memory, but since the data retention characteristics depend on a physical state of a substance forming resistance, sufficient state retention cannot be achieved in many cases.

DETAILED DESCRIPTION

A non-volatile semiconductor memory device according to embodiments includes a memory cell array including one or more first wires, one or more second wires crossing the first wire, and one or more memory cells connected to both the wires at a crossing portion of the first wire and the second wire, the memory cell including a variable resistance element storing data in a non-volatile manner by a resistance value, and a control circuit setting the variable resistance element in a first resistance state by application of first voltage to the memory cell, setting the variable resistance element in a second resistance state by application of second voltage to the memory cell, and reading data from the memory cell by application of third voltage to the memory cell. The control circuit applies to the memory cell at predetermined timing weak write voltage causing the variable resistance element to be held in the first resistance state and the second resistance state.

Hereinafter, a semiconductor memory device according to embodiments will be described with reference to the attached drawings.

[Overview of Semiconductor Memory Device]

Figure 1:
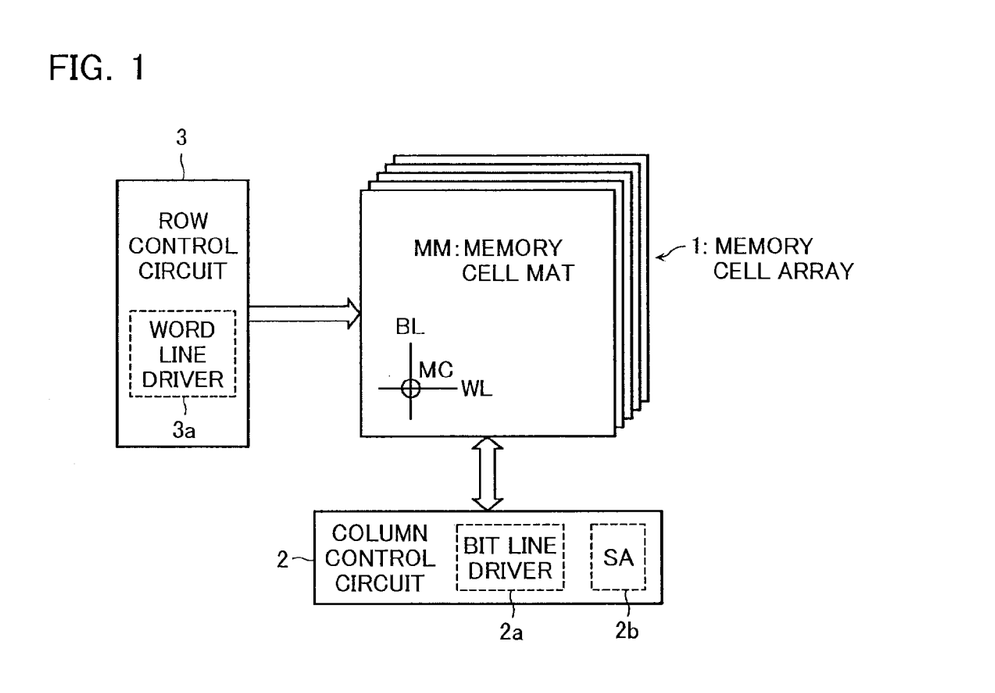
FIG. 1 is a block diagram illustrating an overall configuration of a non-volatile semiconductor memory device according to a first embodiment.

FIG. 1 illustrates a configuration of a semiconductor memory device according to an embodiment. This semiconductor memory device includes a memory cell array 1 and a column control circuit 2 and a row control circuit 3 controlling data erase operation of the memory cell array 1, data write operation to the memory cell array 1, and data read operation from the memory cell array 1. The memory cell array 1 includes a plurality of stacked memory cell mats MM (memory cell layers). Each memory cell mat MM includes a plurality of bit lines BL (first wires) and a plurality of word lines WL (second wires) crossing each other and a memory cell MC connected at each crossing position of the bit line BL and the word line WL.

The column control circuit 2 is connected to the bit lines BL of the memory cell mats MM. The column control circuit 2 controls a bit line BL to erase data of a memory cell MC, write data to the memory cell MC, and read data from the memory cell MC. The column control circuit 2 includes a bit line driver 2a including a decoder and a multiplexer selecting a bit line BL and supplying the bit line BL with voltage required for access operation and a sense amplifier 2b detecting and amplifying current flowing in a memory cell MC at the time of read operation to determine data stored in the memory cell MC.

The row control circuit 3 is connected to the word lines WL of the memory cell mats MM. The row control circuit 3 selects a word line WL at the time of access operation. The row control circuit 3 includes a word line driver 3a supplying the word line WL with voltage required for access operation. The row control circuit 3 as well as the column control circuit 2 is included in an access circuit.

Figure 2:
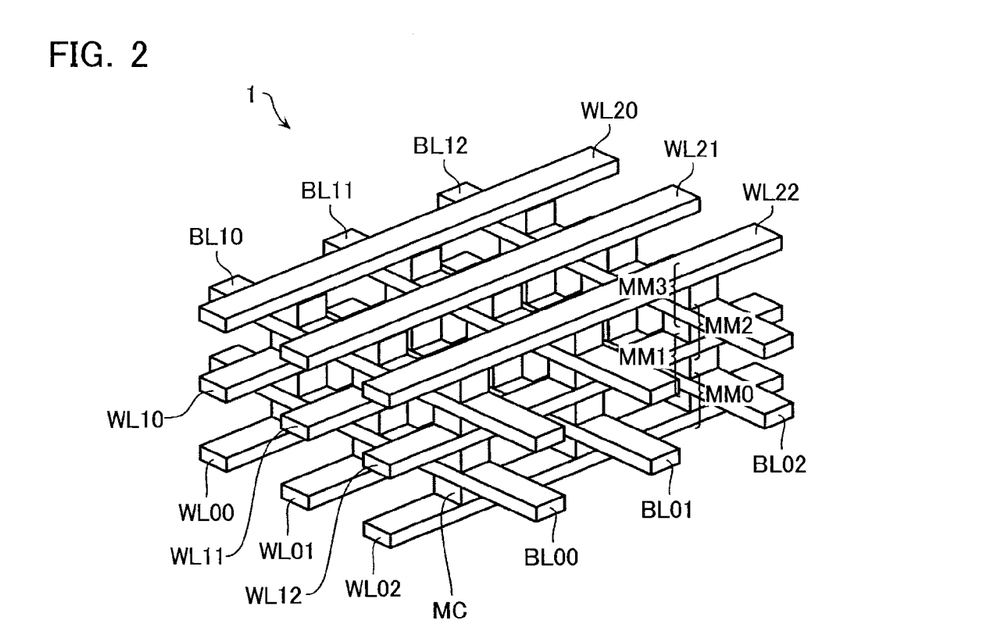
FIG. 2 is a perspective view illustrating a memory cell array structure of the non-volatile semiconductor memory device.

FIG. 2 is a perspective view schematically illustrating a portion of the memory cell array 1.

The memory cell array 1 is a cross point-type memory cell array. Each memory cell mat MM of the memory cell array 1 includes the plurality of bit lines BL arranged in parallel and the plurality of word lines WL arranged in parallel in a direction of crossing the bit lines BL. The memory cell MC is arranged at each crossing portion of a word line WL and a bit line BL in such a manner that the memory cell MC is sandwiched between both of the wires. As described above, the memory cell array 1 is formed by stacking the plurality of memory cell mats MM in a multilayered manner. The memory cell mats MM adjacent vertically share the word lines WL or the bit lines BL. In a case of FIG. 2, a memory cell mat MM0 on the lowermost layer of the memory cell array 1 and a memory cell mat MM1 adjacent on the memory cell mat MM0 share bit lines BL00 to BL02. Although pillar-like stacked layer structures of the memory cells MC are formed at crossing portions of the bit lines BL and the word lines WL seen in a stacking direction in a structure shown in FIG. 2, a structure in which a stacked layer structure of the memory cell MC is formed entirely on a layer between a bit line layer (a layer in which the plurality of bit lines BL are arranged in a second direction) and a word line layer (a layer in which the plurality of word lines WL are arranged in a first direction) may be adopted.

Figure 3:
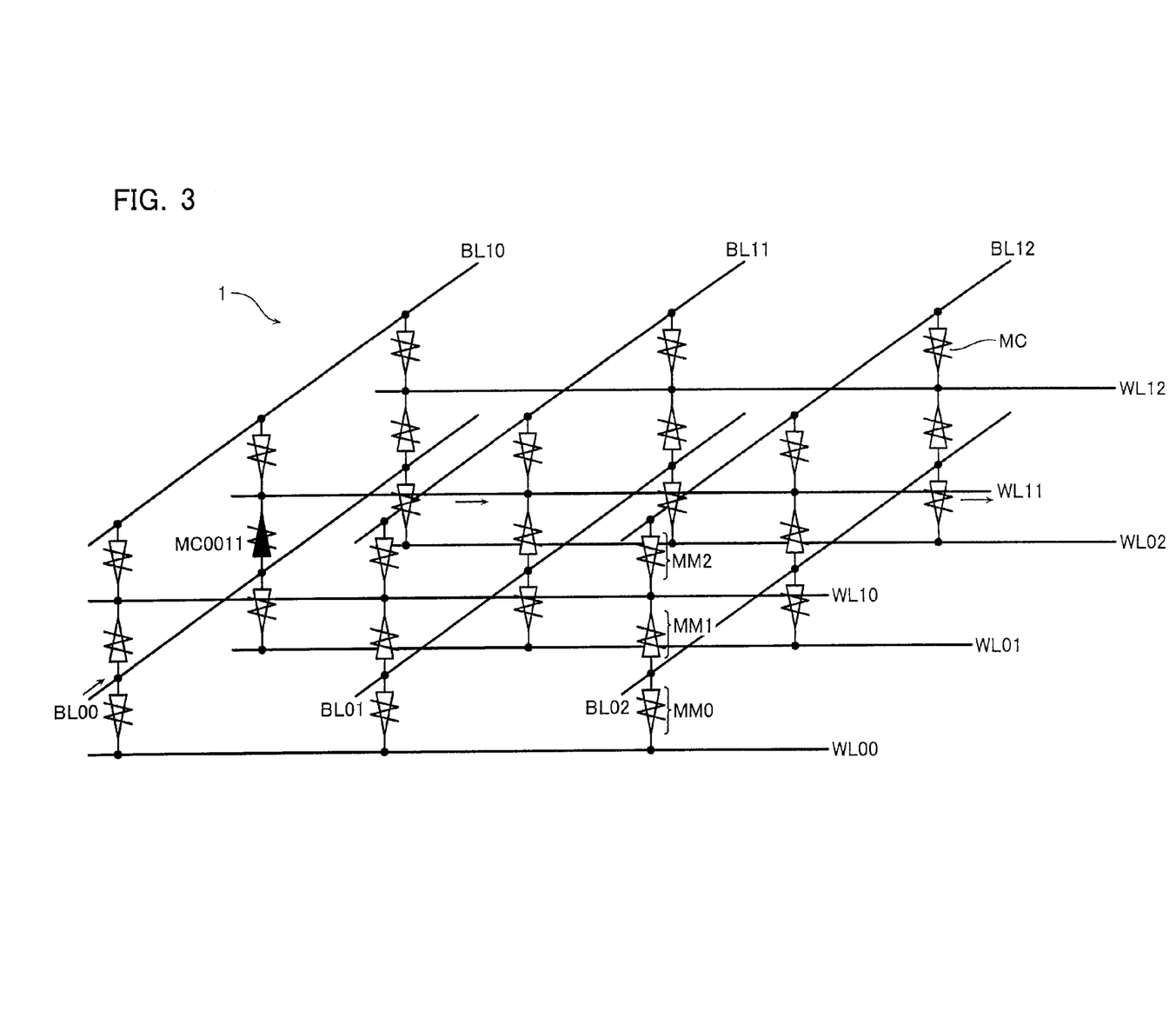
FIG. 3 is an equivalent circuit diagram of the memory cell array.
Figure 4:
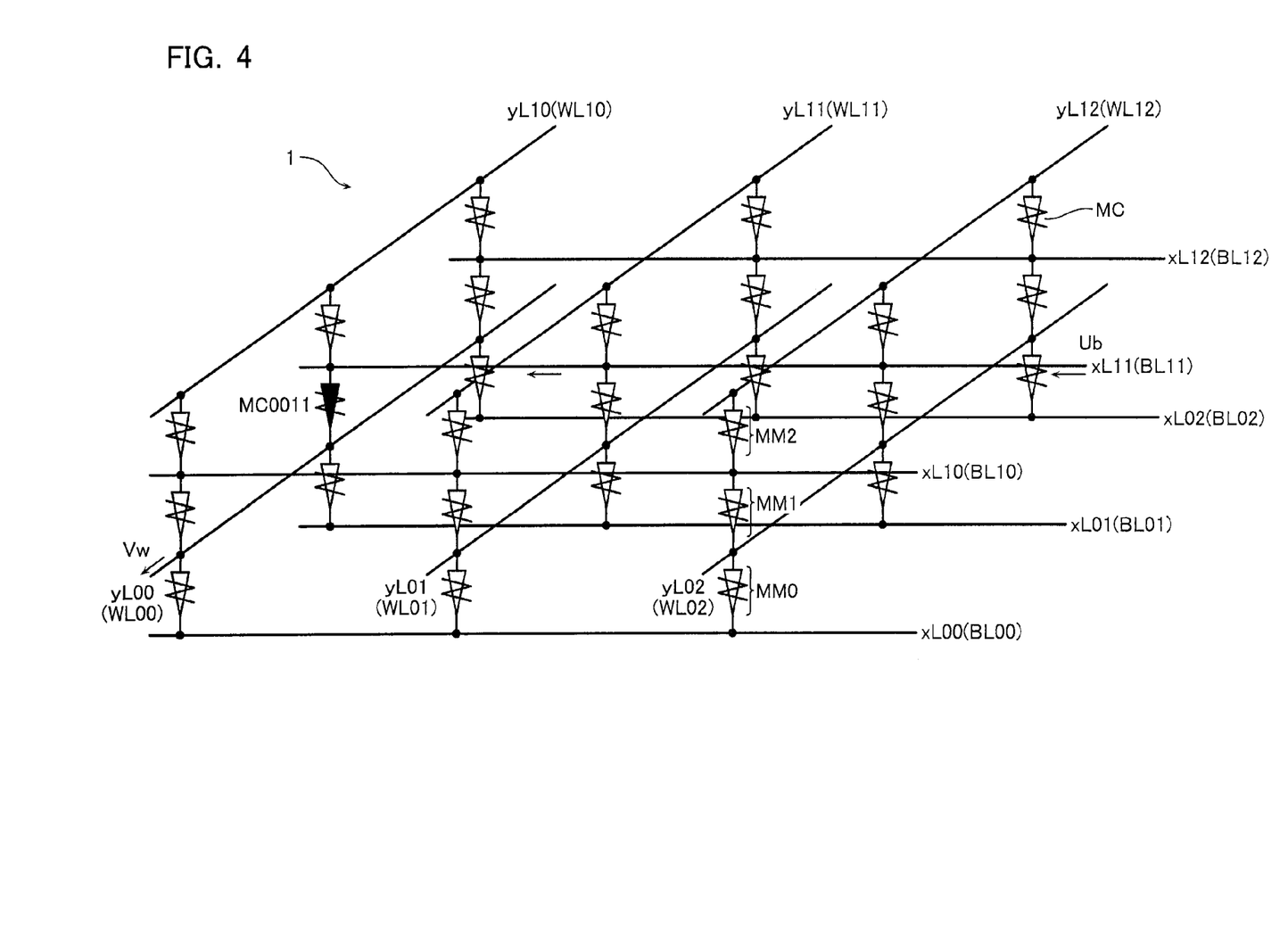
FIG. 4 is an equivalent circuit diagram of another structure of the memory cell array.
Figure 5:
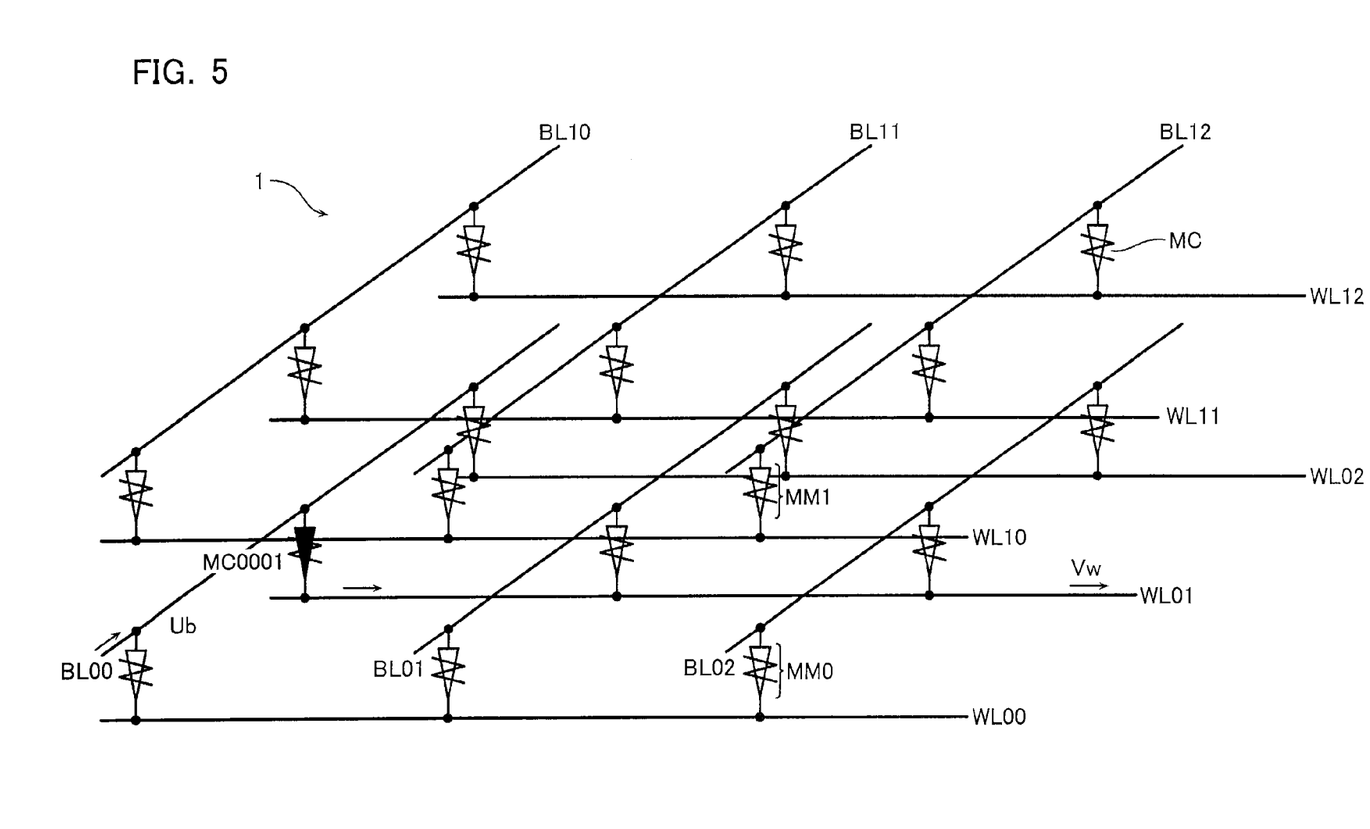
FIG. 5 is an equivalent circuit diagram of another structure of the memory cell array.

FIG. 3 is an equivalent circuit diagram of the memory cell array 1 shown in FIG. 2. As described later in detail, each memory cell MC has variable resistance characteristics and non-ohmic characteristics, and a direction in which current flows more is shown in an elongated triangular shape. Thus, a flatted side of the triangle is referred to as an anode while a sharpened side is referred to as a cathode. In a case where read operation from a memory cell MC0011 in FIG. 3 is to be performed, a bit line BL00 connected on an anode side of the memory cell MC0011 is supplied with read voltage $V_{read}$, and a word line WL11 connected on a cathode side of the memory cell MC0011 is supplied with ground voltage $V_{SS}$. By doing so, current flows as arrows in the figure to perform read operation. Further, in a case where set operation is to be performed, set voltage $V_{set}$ is applied to the bit line BL00, and the ground voltage $V_{SS}$ is applied to the word line WL11. Further, in a case where reset operation is to be performed, the ground voltage $V_{SS}$ is applied to the bit line BL00, and reset voltage $V_{reset}$ is applied to the word line WL11. What kind of potential is supplied to bit lines BL and word lines WL connected to memory cells MC other than the selected memory cell MC0011 is an important respect to ensure that the selected memory cell MC0011 is accessible. Note that, although a current rectifying direction is reversed per memory cell mat MM in the memory cell array 1 according to the present embodiment, current rectifying directions of all the memory cell mats MM can be equal as shown in FIG. 4. Further, although memory cell mats MM share bit lines BL and word lines WL in the memory cell array 1 according to the present embodiment, bit lines BL and word lines WL may be formed independently per memory cell mat MM, and memory cell mats MM may be insulated inbetween, as shown in FIG. 5.

Figure 6:
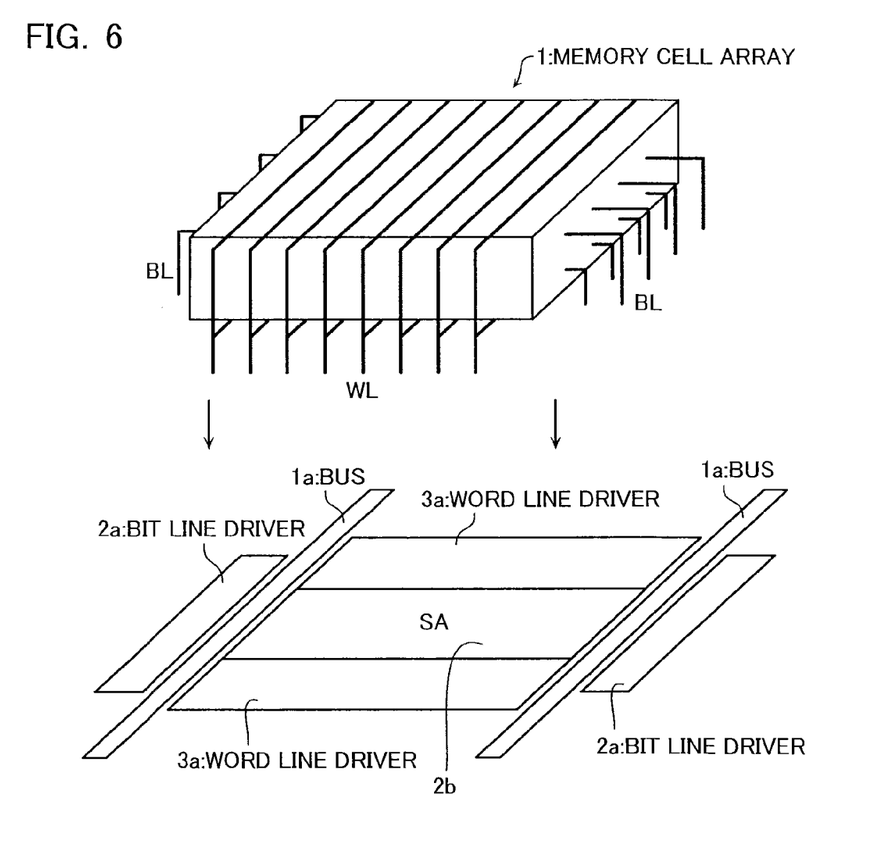
FIG. 6 is a perspective view illustrating a configuration example of a peripheral circuit of the non-volatile semiconductor memory device.

In order to configure a three-dimensional memory with use of the aforementioned cross point-type memory cell array 1, each memory cell array 1 needs to be provided with a sense amplifier, a driver, a decoder, a multiplexer, and the like as shown in FIG. 1 as a peripheral circuit that accesses the three-dimensional memory. An example of this configuration is shown in FIG. 6.

In the example in the figure, four sides of the memory cell array 1 are vertical wiring areas for wiring from the bit lines BL and the word lines WL of the memory cell array 1 to a board circuit. The column control circuit 2 and the row control circuit 3 that access the memory cell array 1 are provided on a board below the memory cell array 1 as shown in the figure. The bit line drivers 2a are arranged at positions corresponding to both the end portions of the memory cell array 1 in a direction of the bit lines BL. The sense amplifier 2b is arranged at the center on the lower side of the memory cell array 1. The word line drivers 3a are arranged at positions corresponding to both the end portions of the memory cell array 1 in a direction of the word lines WL. Buses la are arranged between the sense amplifier 2b and the word line drivers 3a, and the bit line drivers 2a. Accordingly, a chip area of this semiconductor memory device can be approximately equal to an area of the memory cell array 1.

The bit line drivers 2a and the word line drivers 3a select a bit line BL and a word line WL in accordance with an address signal and a command from outside and set voltage at predetermined levels to the selected bit line BL and word line WL. Between the bit line drivers 2a and the sense amplifier 2b, data is transferred via the buses la as parts of a global bus area.

[Memory Cell]

Subsequently, the memory cell MC according to the present embodiment will be described. Note that, although a memory cell using a CBRAM (Conduction Bridge RAM) as a representative of a resistance variable memory element will be described herein, a configuration of an element does not matter as long as the element is an element that can vary its state between a low-resistance state and a high-resistance state depending on voltage to be applied and its polarity and can hold the state to some extent. Further, a configuration positively including a configuration with diode characteristics is considered herein since asymmetry properties of current characteristics to the polarity of applied voltage do not always appear sufficiently only with the resistance variable element. However, an element with diode characteristics does not have to be included in the configuration. In a case where the resistance variable element itself has diode characteristics, the characteristic portion can be separately regarded as a diode.

Figure 7:
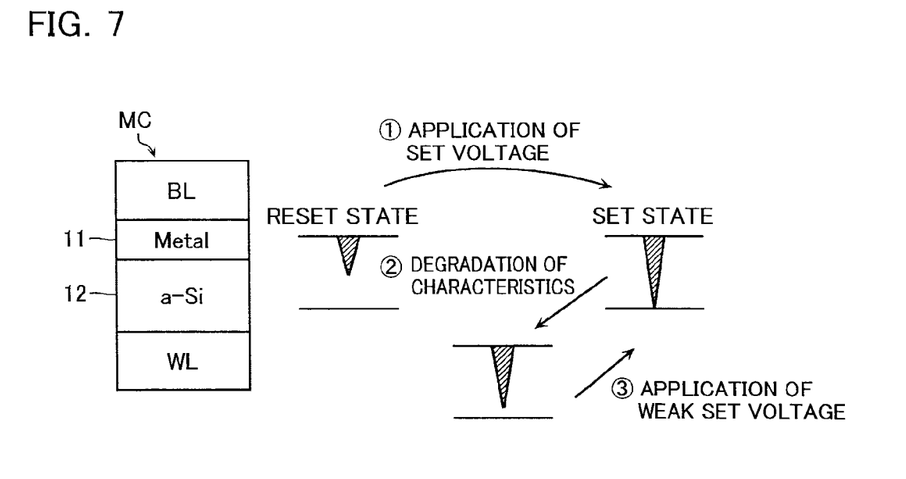
FIG. 7 illustrates a configuration example and a characteristics example of a memory cell of the non-volatile semiconductor memory device.

FIG. 7 illustrates a configuration and characteristics of the memory cell MC according to an embodiment. The memory cell MC includes a metal layer 11 and an amorphous silicon layer 12 between the bit line BL and the word line WL arranged in this order from a side of the bit line BL as shown in a leftmost schematic structural diagram in FIG. 7. The metal layer 11 functions as a generation source of metal ions. The amorphous silicon layer 12 serves as a medium for growth of a metal filament. Note that a p-type doped polysilicon layer or an n-type doped polysilicon layer may be formed between the amorphous silicon layer 12 and the word line WL. Alternatively, a diode may be formed between the amorphous silicon layer 12 and the word line WL.

Note that, although the amorphous silicon layer 12 is used in the structural diagram in FIG. 7, it is not limited to a semiconductor but may be an insulating film such as silicon oxide (SiOx), silicon oxynitride (SiOxNy), silicon nitride (SiNx), or a metal oxide film. Further, the amorphous silicon layer 12 may be a stacked layer structure of these insulating films such as a stacked layer structure of amorphous silicon and silicon oxide. Further, the WL in the structural diagram in FIG. 7 has only to function as an electrode and may be a p-type doped polysilicon, an n-type doped polysilicon, or a metal.

On the right side of the structural diagram in FIG. 7 is shown a schematic diagram for several cell states as a diagram schematically illustrating states and configurations of the memory cell MC. The metal filament is expressed in a downward vertically-long triangle. As for the memory cell MC, a side of the bit line BL is referred to as an anode while a side of the word line WL is referred to as a cathode.

In the memory cell MC in a reset state, the filament formed in the memory cell MC does not penetrate the amorphous silicon layer 12 and is in a high-resistance state. When set voltage is applied in a positive direction to the memory cell MC in the reset state, the filament penetrates the amorphous silicon layer 12 and becomes in a set state (a low-resistance state). Hereinafter, applying set voltage to the memory cell MC in the reset state to get the memory cell MC into the set state is referred to as set operation.

In the memory cell MC in the set state, there is a case in which the filament changes in shape as time goes by, and in which the memory cell MC varies its state to a higher-resistance state than the set state (hereinafter, a weak reset state). There is also a case in which the memory cell MC varies its state to the weak reset state due to degradation of characteristics caused by reception of backward voltage at the time of read operation from another memory cell, or the like. In the present embodiment, in order to prevent such a variation of the memory cell MC to the weak reset state, weak set voltage $V_{wset}$, which is smaller than the set voltage, is applied in a forward direction of the memory cell MC to maintain the memory cell MC in the set state.

[Magnitude of Weak Set Voltage $V_{wset}$]

Subsequently, a method for setting the weak set voltage $V_{wset}$ will be described. The magnitude of the weak set voltage $V_{wset}$ is determined in consideration of data retention characteristics and disturbance characteristics of the memory cell MC.

Figure 8:
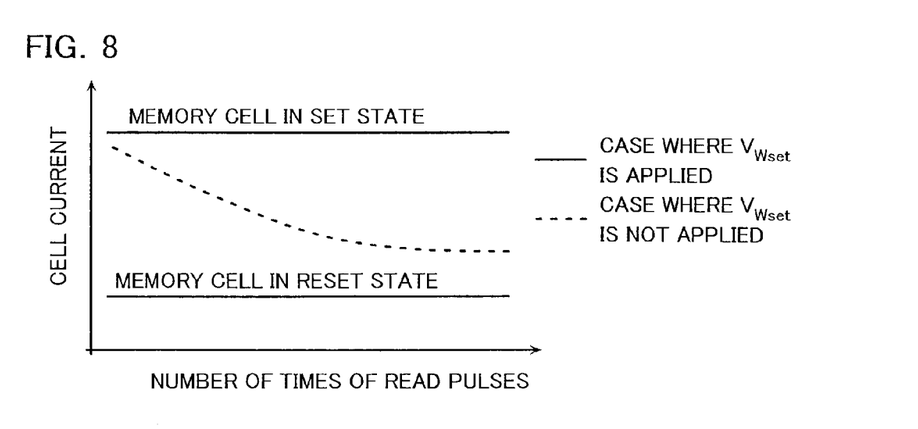
FIG. 8 illustrates data retention characteristics of the memory cell.

FIG. 8 is a schematic view illustrating data retention characteristics of the memory cell MC. Solid lines in the figure represent cell current in a case where the memory cell MC in the set state and in the reset state is respectively provided with the weak set voltage $V_{wset}$ as well as the read voltage $V_{read}$. A dotted line represents cell current in a case where the memory cell MC in the set state is provided with the read voltage $V_{read}$ without being provided with the weak set voltage $V_{wset}$. It is apparent from the figure that the memory cell MC can hold a resistance state for a longer time in a case where the memory cell MC in the set state is provided with the weak set voltage $V_{wset}$.

Figure 9:
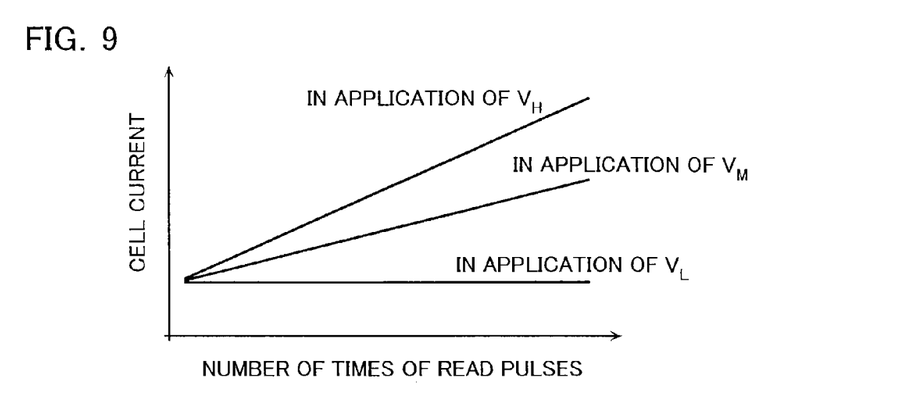
FIG. 9 illustrates disturbance characteristics of the memory cell.

FIG. 9 is a schematic view illustrating disturbance characteristics of the memory cell MC and shows variations of cell current in a case where voltage $V_H$, $V_M$, and $V_L$ ($>V_M>V_L$) is respectively applied in a forward direction to the memory cell in the reset state. It is apparent from the figure that, the larger the forward voltage to be applied to the memory cell MC in the reset state is, the more easily the resistance of the memory cell MC varies, that is, the more easily erroneous set occurs.

Figure 10A:
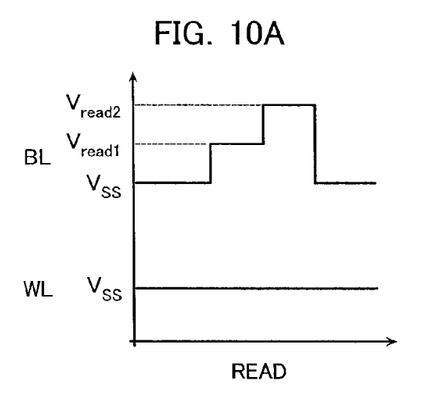
FIGS. 10A and 10B illustrate an example of a method for setting weak set voltage of the memory cell.
Figure 10B:
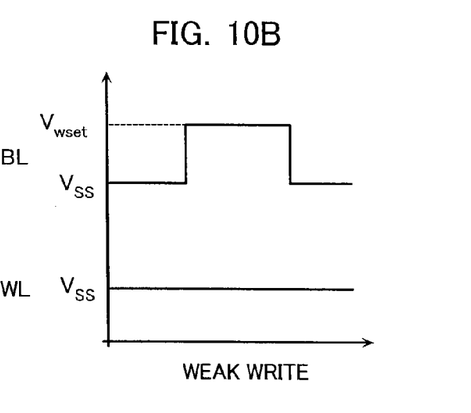

In consideration of the above respects, the magnitude of the weak set voltage $V_{wset}$ is set large enough to prevent an increase in the resistance value of the memory cell MC and small enough to prevent the memory cell MC in the reset state from varying a state thereof to the set state, that is, to be smaller than set voltage. For example, as shown in FIG. 10A, in a case where read voltage to be applied to the memory cell MC varies in several phases at the time of read operation, the weak set voltage $V_{wset}$ can be set in the range between maximum voltage $V_{read2}$ and minimum voltage $V_{read1}$ of the read voltage or can be set to be equal to the read voltage $V_{read1}$ or $V_{read2}$ as shown in FIG. 10B. Further, under the condition that the memory cell MC in the reset state does not vary a state thereof to the set state, the weak set voltage $V_{wset}$ can be set to a voltage larger than the read voltage $V_{read2}$ or a voltage smaller than the read voltage $V_{read1}$. The weak set voltage $V_{wset}$ is adjusted arbitrarily in accordance with the material, size and the like of the memory cell MC.

[Memory Cell as Target for Weak Set Operation]

Figure 11:
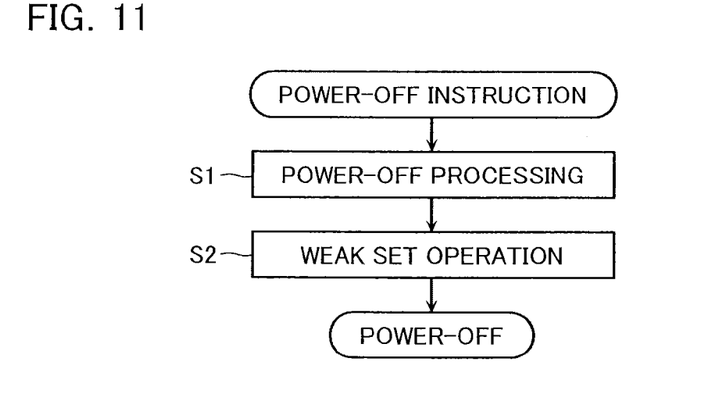
FIG. 11 is a flowchart illustrating an example of weak set operation of the non-volatile semiconductor memory device.

In a case where operation of applying the weak set voltage $V_{wset}$ to the memory cell MC is referred to as weak set operation, a method for selecting a memory cell MC as a target for the weak set operation can be controlled arbitrarily. For example, the weak set operation can be performed to all or part of the memory cells MC included in the memory cell array 1 immediately before power-off of the non-volatile semiconductor memory device, at regular time intervals, at the time of predetermined operation, or the like. FIG. 11 shows an example in which the weak set operation is performed immediately before power-off. In this example, power-off processing such as data save and backup processing is first performed after a power-off instruction (step S1), the weak set operation is thereafter performed (step S2), and power is off after completion of the weak set operation. Such a method can be achieved by applying equal word line voltage to all the word lines connected to the targeted memory cells MC and applying equal bit line voltage to all the bit lines connected to the targeted memory cells MC.

Figure 12:
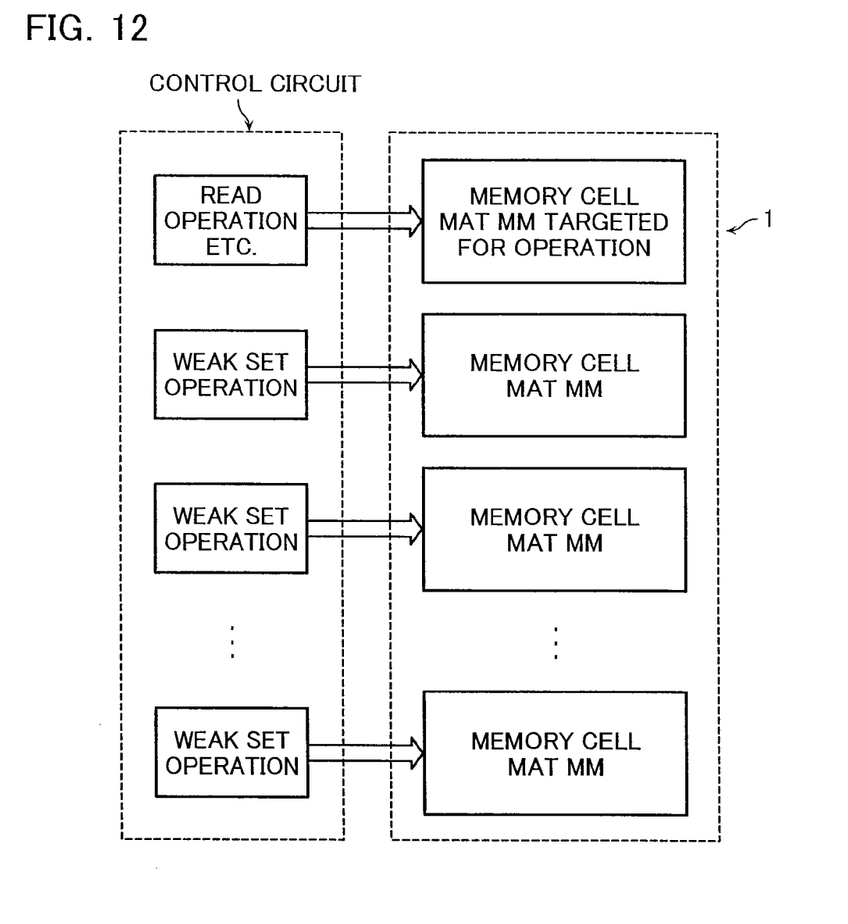
FIG. 12 is a schematic view illustrating an example of the weak set operation of the non-volatile semiconductor memory device.

Further, as shown in FIG. 12, when read operation is performed to a memory cell mat MM targeted for the operation, weak set operation can be performed to other plural memory cell mats MM (hereinafter, memory cell mats not targeted for the operation). That is, in the memory cell mat MM targeted for the operation, a memory cell MC targeted for read operation is selected by the aforementioned column control circuit 2 and row control circuit 3 and is applied with read voltage, and data stored in the memory cell MC targeted for read operation is latched to the sense amplifier 2b. Here, unlike in the read operation, the sense amplifier 2b is not used in the weak set operation. Accordingly, the weak set operation can be performed to other memory cell mats MM during the read operation to the memory cell mat MM targeted for read operation. Further, the weak set operation, unlike the read operation, can be performed to plural memory cells MC connected to the same bit line BL at a time. Meanwhile, in FIG. 12, a driver, a decoder, and the like required for the read operation are omitted to show each memory cell mat MM as a block. Similarly, a driver and the like required for the weak set operation are omitted.

Note that the weak set operation to the memory cell mats MM not targeted for the operation may be performed not only at the time of read operation to the memory cell mat MM targeted for the operation but also at the time of set operation or reset operation. Further, the weak set operation may be performed only to part of the memory cell mats MM not targeted for the operation or to part of the memory cells MC included in certain memory cell mats MM not targeted for the operation.

In this manner, since the weak set operation differs from the erase, write, and read operation, the weak set operation can be performed to a plurality of memory cells sharing a plurality of bit lines BL and a plurality of word lines WL at a time during access to a memory cell MC. Meanwhile, in a case where a variation from the reset state to the set state occurs easily due to characteristics of a memory cell MC, weak reset voltage has only to be applied at predetermined timing. Such "weak set voltage" and "weak reset voltage" are collectively referred to as "weak write voltage."

[Others]

While certain embodiments have been described, these embodiments have been presented by way of example only, and are not intended to limit the scope of the inventions. Indeed, the novel methods and systems described herein maybe embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A non-volatile semiconductor memory device comprising:
    a memory cell array including one or more first wires, one or more second wires crossing the first wire, and one or more memory cells connected to both the wires at a crossing portion of the first wire and the second wire, the memory cell including a variable resistance element storing data in a non-volatile manner by a resistance value; and a control circuit setting the variable resistance element in a first resistance state by application of first voltage to the memory cell, setting the variable resistance element in a second resistance state by application of second voltage to the memory cell, and reading data from the memory cell by application of third voltage to the memory cell, the control circuit applying to the memory cell at predetermined timing weak write voltage causing the variable resistance element to be held in the first resistance state and the second resistance state, and the weak write voltage being set in a range between a maximum value and a minimum value of two or more read voltages to be used at the time of read operation.

2. The non-volatile semiconductor memory device according to claim 1, wherein the weak write voltage is applied to the memory cells connected to the first wires and the second wires at a time.

3. The non-volatile semiconductor memory device according to claim 1, wherein the weak write voltage is applied prior to power-off of the non-volatile semiconductor memory device.

4. The non-volatile semiconductor memory device according to claim 1, wherein the weak write voltage is applied to unselected memory cell mats which are not operated at the time of read operation, write operation, or erase operation of a selected memory cell mat, the unselected and the selected memory cell mats including the memory cells sharing the first and second wires respectively.

5. The non-volatile semiconductor memory device according to claim 4, wherein the control circuit further includes a sense amplifier which latches data read from the memory cell in the selected memory cell mat at the time of the read operation, and wherein the sense amplifier does not latch data read from the memory cell in the unselected memory cell mats.

6. The non-volatile semiconductor memory device according to claim 2, wherein, when the weak write voltage is applied, the control circuit applies an equal first wire voltage to all the first wires connected to the memory cells to which the weak write voltage is applied and the control circuit applies an equal second wire voltage to all the second wires connected to the memory cells to which the weak write voltage is applied.

7. The non-volatile semiconductor memory device according to claim 1, wherein polarities of the first voltage and the second voltage are reversed, a retention of the first resistance state is shorter than that of the second resistance state, a polarity of the weak write voltage is same as the polarity of the first voltage and an amplitude of the weak write voltage is less than an amplitude of the first voltage.

8. A non-volatile semiconductor memory device comprising:

a memory cell array including a plurality of first wires, a plurality of second wires crossing the first wires, and a plurality of memory cells connected to both the wires at crossing portions of the first wires and the second wires, each of the memory cells including a variable resistance element storing data in a non-volatile manner by a resistance value; and a control circuit setting the variable resistance element in a first resistance state by application of first voltage to one of the memory cells, setting the variable resistance element in a second resistance state by application of second voltage to one of the memory cells, and reading data from each of the memory cells by application of third voltage to one of the memory cells, the control circuit applying weak write voltage to two or more of the memory cells connected to the same first wire at a time, and when the weak write voltage is applied, the control circuit applying an equal first write voltage to all the first wires connected to the memory cells to which the weak write voltage is applied, and the control circuit applying an equal second write voltage to all the second wires connected to the memory cells to which the weak write voltage is applied.

9. The non-volatile semiconductor memory device according to claim 8, wherein the weak write voltage is set in a range between a maximum value and a minimum value of two or more read voltages to be used at the time of read operation.

10. The non-volatile semiconductor memory device according to claim 8, wherein the weak write voltage is applied prior to power-off of the non-volatile semiconductor memory device.

11. The non-volatile semiconductor memory device according to claim 8, wherein the weak write voltage is applied to unselected memory cell mats which are not operated at the time of read operation, write operation, or erase operation of a selected memory cell mat, the unselected and the selected memory cell mats including the memory cells sharing the first and second wires respectively.

12. The non-volatile semiconductor memory device according to claim 8, wherein the control circuit further includes sense amplifiers which latches data read from the memory cells in the selected memory cell mat at the time of the read operation, and wherein each of the sense amplifiers does not latch data read from the memory cell in the unselected memory cell mats.

13. The non-volatile semiconductor memory device according to claim 8, wherein the variable resistance element has a CBRAM structure including a metal layer and a medium layer contacting the metal layer.

14. A non-volatile semiconductor memory device comprising:

a memory cell array comprising a plurality of memory mats each including a plurality of first wires, a plurality of second wires crossing the first wires, and a plurality of memory cells connected to both the wires at crossing portions of the first wires and the second wires, each of the memory cells including a variable resistance element storing data in a non-volatile manner by a resistance value; and a control circuit setting the variable resistance element in a first resistance state by application of first voltage to one of the memory cells, setting the variable resistance element in a second resistance state by application of second voltage to one of the memory cells, and reading data from each of the memory cells by application of third voltage to one of the memory cells, the control circuit applies weak write voltage causing the variable resistance element to be held in the first resistance state and the second resistance state to memory cells of unselected memory cell mats which is not operated at the time of read operation, write operation, or erase operation of a selected memory cell mat.

15. The non-volatile semiconductor memory device according to claim 14, wherein the weak write voltage is set in a range between a maximum value and a minimum value of two or more read voltages to be used at the time of read operation.

16. The non-volatile semiconductor memory device according to claim 14, wherein the weak write voltage is applied prior to power-off of the non-volatile semiconductor memory device.

17. The non-volatile semiconductor memory device according to claim 14, wherein,
when the weak write voltage is applied,
the control circuit applies an equal first write voltage to all the first wires connected to the memory cells to which the weak write voltage is applied and
the control circuit applies an equal second wire voltage to all the second wires connected to the memory cells to which the weak write voltage is applied.

18. The non-volatile semiconductor memory device according to claim 14, wherein the variable resistance element has a CBRAM structure including a metal layer and a medium layer contacting the metal layer.

* * * * *